US008937691B2

(12) United States Patent
Sun et al.

(10) Patent No.: US 8,937,691 B2
(45) Date of Patent: Jan. 20, 2015

(54) TFT-LCD ARRAY SUBSTRATE, MANUFACTURING METHOD OF THE SAME AND TFT-LCD

(75) Inventors: Yang Sun, Beijing (CN); Yinglong Huang, Beijing (CN); Jing Lv, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 94 days.

(21) Appl. No.: 13/278,382

(22) Filed: Oct. 21, 2011

(65) Prior Publication Data

US 2012/0099043 A1   Apr. 26, 2012

(30) Foreign Application Priority Data

Oct. 22, 2010   (CN) .......................... 2010 1 0523135

(51) Int. Cl.
*G02F 1/1333*   (2006.01)
*G02F 1/136*   (2006.01)
*G02F 1/13*   (2006.01)
*H01L 29/417*   (2006.01)
*G09G 3/00*   (2006.01)
*G09G 3/36*   (2006.01)
*H01L 27/12*   (2006.01)
*G02F 1/1362*   (2006.01)

(52) U.S. Cl.
CPC .......... *H01L 29/41733* (2013.01); *G09G 3/006* (2013.01); *G09G 3/3611* (2013.01); *H01L 27/124* (2013.01); *G02F 2001/136236* (2013.01); *G02F 2001/136254* (2013.01); *G02F 2203/69* (2013.01); *G09G 2300/0408* (2013.01)

USPC ................................. 349/54; 349/48; 349/192

(58) Field of Classification Search
USPC .............................................. 349/48, 54, 192
See application file for complete search history.

(56) References Cited

U.S. PATENT DOCUMENTS

| 2008/0117345 A1* | 5/2008 | Ishii et al. ........................ 349/40 |
| 2009/0284706 A1* | 11/2009 | Liu et al. ........................ 349/150 |
| 2010/0045886 A1* | 2/2010 | Kwak ................................ 349/40 |
| 2010/0195011 A1* | 8/2010 | Tanaka et al. .................... 349/40 |

FOREIGN PATENT DOCUMENTS

| CN | 101825813 A | 9/2010 |
| TW | 200949345 A | 12/2009 |

OTHER PUBLICATIONS

First Chinese Office Action dated Aug. 7, 2013; Appln. 201010523135.8.
First Chinese Office Action dated Apr. 9, 2014; Appln. No. 201010523135.8.
Third Chinese Office Action Appln. No. 2010105231358; Issued Oct. 10, 2014.

* cited by examiner

*Primary Examiner* — Nathanael R Briggs
(74) *Attorney, Agent, or Firm* — Ladas & Parry LLP

(57) ABSTRACT

According to the embodiments of the invention, a TFT-LCD array substrate, a manufacturing method thereof and a TFT-LCD are provided. The TFT-LCD array substrate comprises: a gate line; a gate line test line; a gate line test terminal; a gate line drive circuit connected to the gate line; and a test TFT. A gate electrode and a drain electrode of the test TFT are connected to the gate line test line, a source electrode of the test TFT is connected to the gate line, and the gate line test terminal is connected to the gate line test line.

12 Claims, 9 Drawing Sheets

A4-A4

B4-B4

C4-C4

A1-A1

B1-B1

C1-C1

A3-A3

B3-B3

C3-C3

TFT-LCD ARRAY SUBSTRATE, MANUFACTURING METHOD OF THE SAME AND TFT-LCD

BACKGROUND

Embodiments of the invention relate to an array substrate, a manufacturing method thereof and a thin film transistor crystal display (TFT-LCD).

TFT-LCD comprises an array substrate, a colour filter substrate and a liquid crystal layer disposed between the array substrate and the colour filter substrate. The array substrate and the colour filter substrate are formed on two glass substrates with large dimensions, respectively. Moreover, they are formed on the corresponding LCD panel region of each of the glass substrates. A single glass substrate comprises a plurality of LCD panel regions, and the region between adjacent LCD panel regions is referred as blank region. Liquid crystal molecules are filled between the array substrate and the colour filter substrate after the assembling of the array substrate and the colour filter substrate, thus a finished product of TFT-LCD is obtained with following processes such as cutting. Before being assembled with the colour filter substrate, the array substrate should be tested, with the qualified ones proceeding to the assembling step and the disqualified ones proceeding to a repairing step.

In order to test the array substrates, various test lines are formed on the array substrate. FIG. 1 shows a schematic view of a structure of a conventional TFT-LCD array substrate. The TFT-LCD array substrate comprises a gate line 2b, a data line 5d and a common electrode line 9, with the gate line 2b connected to the gate electrode of the thin film transistor in the display region 10, and the data line 5d connected to the source electrode of the thin film transistor in the display region 10. In order to test the gate line 2b, the data line 5d and the common electrode line 9, a gate line test terminal 2G, a data line test terminal 5E and a common electrode line test terminal 9c are provided. There could be a plurality of the gate line test terminals 2G, with each of the gate line test terminals 2G connected to the gate line test line 5c, and each of the gate line test lines 5c connected to a portion of the gate lines 2b. There could also be a plurality of the data line test terminals 5E, with each of the data line test terminal 5E connected to the data line test line 5L, and each of the data line test lines 5L connected to a portion of the data lines. All of the test terminals are formed in the blank regions of the glass substrate. After the assembling and cutting steps, the obtained LCD panel remains only the area surrounded by the dashed line in the figure, the blank regions provided with the test terminals and a portion of the extensions of the data lines, the gate lines and the common electrode lines formed therein are cut away.

At present, in some of the LCDs, a gate line drive circuit is provided on the array substrate, and such circuit is referred as GOA (Gate On Array) circuit. The GOA circuit is used to drive the gate lines, thus it is connected to each of the gate lines.

As to the TFT-LCD array substrate comprising the GOA circuit, the test lines may be connected to the GOA circuit, the gate lines may be tested by inputting control signals into the GOA circuits, and thus the test cost is increased in view of the relatively more complicated control signals required.

SUMMARY

According to an aspect of the invention, a TFT-LCD array substrate is provided. The TFT-LCD array substrate comprises: a gate line; a gate line test line; a gate line test terminal; a gate line drive circuit connected to the gate line; and a test TFT. A gate electrode and a drain electrode of the test TFT are connected to the gate line test line, a source electrode of the test TFT is connected to the gate line, and the gate line test terminal is connected to the gate line test line.

According to another aspect of the invention, a TFT-LCD is provided. The TFT-LCD comprises a colour filter substrate and a TFT-LCD array substrate as described above. The gate line test line is connected to a first terminal of the gate line drive circuit, and the first terminal outputs a signal that keeps the test TFT off.

According to still another aspect of the invention, a manufacturing method of a TFT-LCD array substrate is provided. The manufacturing method comprises: Step 11 of forming a gate line and a gate electrode of a test TFT on the array substrate; and Step 12 of forming an active layer, a source electrode, a drain electrode and a channel of the test TFT, a gate line test line and a gate line test terminal on the array substrate, wherein the drain electrode and the gate electrode of the test TFT are connected to the gate line test line, the source electrode of the test TFT is connected to the gate line, and the gate line test terminal is connected to the gate line test line.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The invention will become more fully understood from the detailed description given hereinafter and the accompanying drawings which are given by way of illustration only, and thus are not limitative of the invention and wherein:

FIG. 3b shows a sectional view taken along the line A4-A4 of FIG. 3a;

FIG. 3c shows a sectional view taken along the line B4-B4 of FIG. 3a;

FIG. 3d shows a sectional view taken along the line C4-C4 of FIG. 3a;

FIG. 4b shows a sectional view taken along the line A1-A1 of FIG. 4a;

FIG. 4c shows a sectional view taken along the line B1-B1 of FIG. 4a;

FIG. 4d shows a sectional view taken along the line C1-C1 of FIG. 4a;

FIG. 5b shows a sectional view taken along the line A2-A2 of FIG. 5a;

FIG. 5c shows a sectional view taken along the line B2-B2 of FIG. 5a;

FIG. 5d shows a sectional view taken along the line C2-C2 of FIG. 5a;

FIG. 6b shows a sectional view taken along the line A3-A3 of FIG. 6a;

FIG. 6c shows a sectional view taken along the line B3-B3 of FIG. 6a; and

FIG. 6d shows a sectional view taken along the line C3-C3 of FIG. 6a.

DESCRIPTION OF THE EMBODIMENTS

Hereinafter, the embodiments of the invention will be described in detail with reference to the accompanying drawings so that the objects, technical solutions and advantages of the embodiments of the invention will become more apparent. It should be noted that the embodiments described below merely are a portion of but not all of the embodiments of the invention, and thus various modifications, combinations and alterations may be made on basis of the described embodiments without departing from the spirit and scope of the invention.

Figure 1:
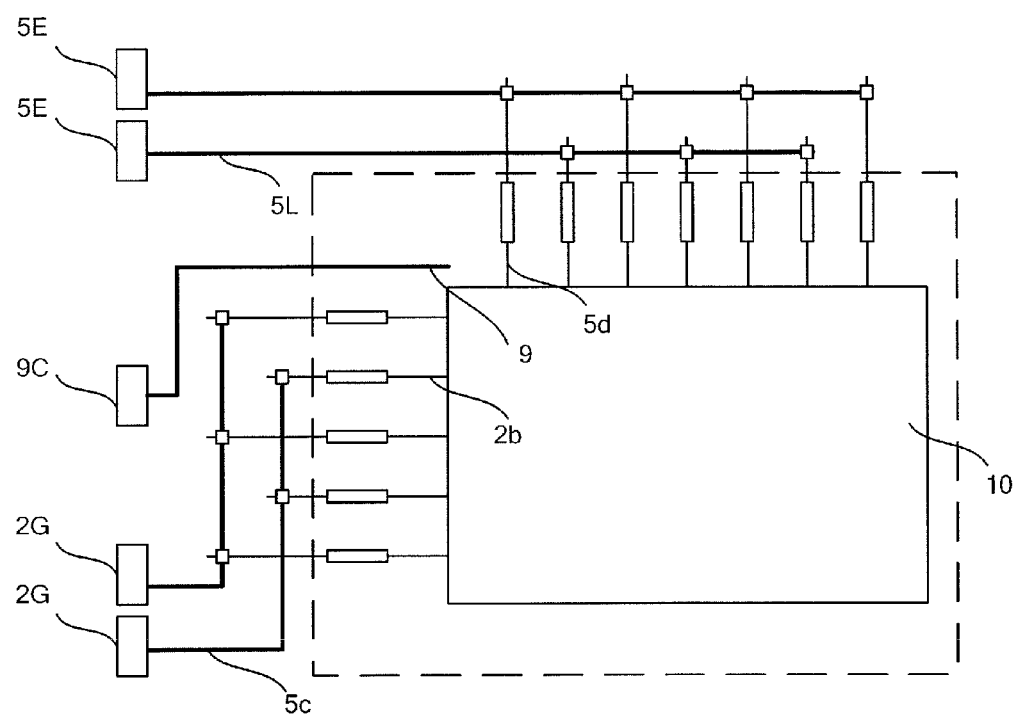
FIG. 1 shows a schematic view of a structure of a conventional TFT-LCD array substrate.
Figure 2:
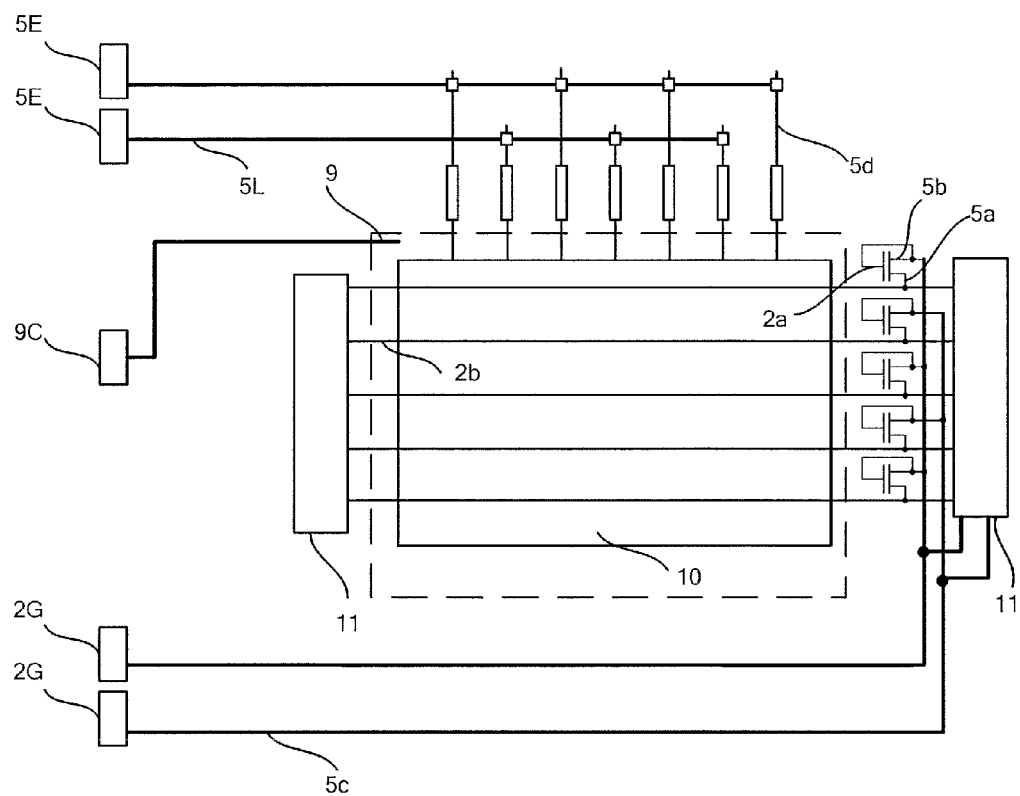
FIG. 2 shows a schematic view of a structure of a TFT-LCD array substrate according to an embodiment of the invention.

FIG. 2 illustrates the schematic view of the structure of the TFT-LCD array substrate according to an embodiment of the invention. The TFT-LCD array substrate comprises gate lines 2b, gate line test lines 5c, gate line test terminals 2G, a GOA circuit 11 and a plurality of test TFTs. The GOA circuit 11 is connected to each of the gate lines 2b. A gate electrode 2a and a drain electrode 5a of the test TFT are connected to the gate line test line 5c, and a source electrode 5b of the test TFT is connected to the gate line 2b. The gate line test terminal 2G is connected to the gate line test line 5c.

The test TFTs are provided between the GOA circuit 11 and the gate lines 2b, that is, the test TFTs are connected between the GOA circuit 11 and the gate lines 2b. For example, the test TFTs are provided in the region between the regions of the GOA circuit 11 and the gate lines 2b. The reasons for providing the test TFTs as such are that: the test TFTs act as switches, they are turned on by applying signals to the gate line test lines 5c and then signals are applied to the gate lines; in this way, it is not necessary to apply signals to the gate lines through the GOA circuit and signals can be applied to the gate lines directly. The signals applied to the gate lines may act as test signals for the gate lines or drive signals for the test TFTs. Furthermore, it is not required for the signals applied to the gate lines to pass through the GOA circuit, thereby the complexity of the applied signals can be reduced and the test costs can be decreased.

There could be a plurality of the gate line test lines 5c, with each of the gate line test lines 5c connected to a portion of the gate lines 2b through corresponding test TFTs to ensure that each of the gate lines 2b could be tested. For the purpose of simplicity, two gate line test lines 5c are shown in FIG. 2. One of the gate line test lines 5c connects to one of the gate line test terminal 2G, and the other of the gate line test lines 5c connects to the other of the gate line test terminal 2G.

In an example, there could be two test terminals 2G, with the odd numbered gate lines connected to one of the test terminals, and the even numbered gate lines connected to the other of the test terminals. If a negative result is monitored during the application of the signals to the test terminal connected to the odd numbered gate lines, only the odd numbered gate lines are tested, and the even numbered ones are not necessary to be tested. If a negative result is monitored during the application of the signals to the test terminal connected to the even numbered gate lines, only the even numbered gate lines are tested, and the odd numbered ones are not necessary to be tested. Therefore, the range of the gate lines to be tested is narrowed, thus the test efficiency can be improved.

In the array substrate as shown in FIG. 2, the gate line test line is connected to the gate line through the corresponding test TFT. The gate and drain electrodes of the test TFT are both connected to the gate line test line. When a voltage is applied to the gate line test line, the test TFT connected to this gate line test line is turned on, and then the voltage is applied to the gate line connected to such test TFT, thereby enabling the test of the gate line. When no voltage is applied to the gate line test line, the test TFT connected to the gate line test line is kept off, and in this case, each of the gate lines works normally without interfering with each other.

In the array substrate as shown in FIG. 2, after the test is completed, the glass substrate is subjected to the cutting process, and the blank regions in the glass substrates are cut away. At this time, all of the gate line test terminals are also cut away, each of the gate line test lines connects to a plurality of the test TFTs, thereby achieving the array substrate for assembling. If electric signals such as interference signals are received by the ends of the gate line test lines remained in the LCD cells after the assembling and cutting processes, the gate lines of the LCD may be electrically connected with each other, thereby a display error may be resulted.

In order to avoid the above mentioned problem, in the array substrate as shown in FIG. 2, the gate line test line may also be connected to a first terminal (not shown in FIG. 2) of the GOA circuit. Such first terminal could be the terminal to output the signal keeping the test TFT off, e.g., a grounding terminal. In addition, in the case that the test TFT is an N type TFT, the first terminal may also be a low-voltage terminal.

It should be understood that, during the test of the TFT-LCD array substrate as shown in FIG. 2, the GOA circuit is not powered, that is, low-voltage signal or grounding signal is not output by the first terminal. In such case, the first terminal will not interfere with the test when the test signal is applied to the test TFT by the gate line test terminal.

However, upon finishing the assembling of the array substrates and the colour filter substrates, the GOA circuit is powered, the first terminal outputs low-voltage signal or grounding signal, thereby reliably keeping the test TFT off after the cutting off the gate line test terminal.

The array substrate according to the embodiment of the invention can keep the test TFT on with the voltage being applied to the gate line test line during the test process, thereby applying the voltage to each of the gate lines so that each of the gate lines can be tested. After obtaining the final array substrate product, voltage is no longer applied to the gate line test line, all test TFTs are turned off, and in this case, the gate lines can not be electrically connected with each other so that they can properly work without interfering with each other.

In the array substrate according to the embodiment of the invention, the gate line connects to the gate line test line through the corresponding test TFT. The gate and drain electrodes of the test TFT are connected to the gate line test lines, respectively. The source electrode of the test TFT is connected to the gate line. In this way, during the test of the gate lines formed on the array substrate comprising the GOA circuit, the testing signal can be input merely by the gate line test terminal and no complicated control signals are required, thereby the costs can be reduced.

In FIG. 2, the data lines 5d and the common electrode lines 9 are further provided, which could be tested using the conventional test methods.

Figure 3A:
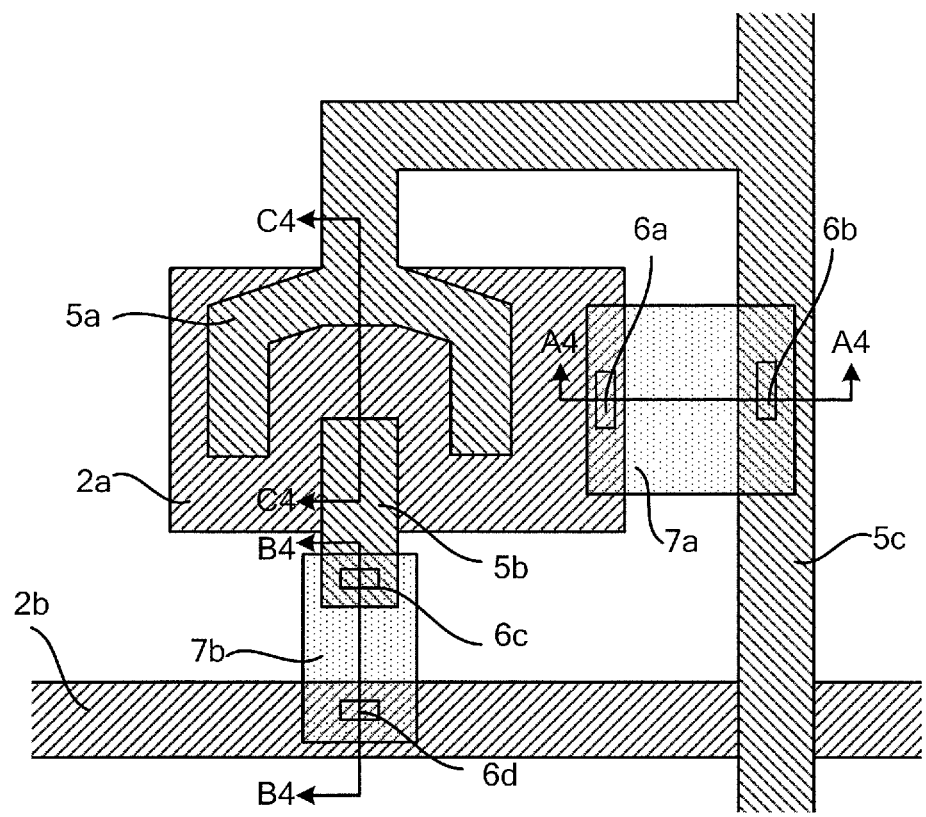
FIG. 3a shows a schematic view of the connection relationships between the test TFT and the gate line and the gate line test line.
Figure 3B:
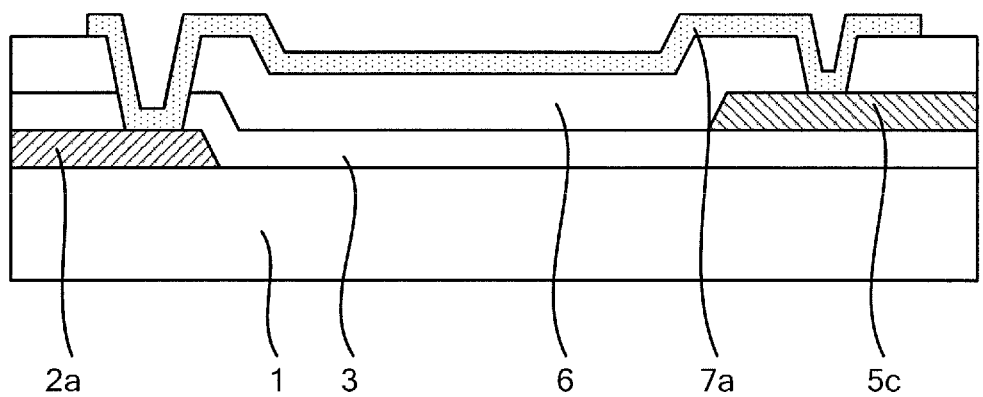
Figure 3C:
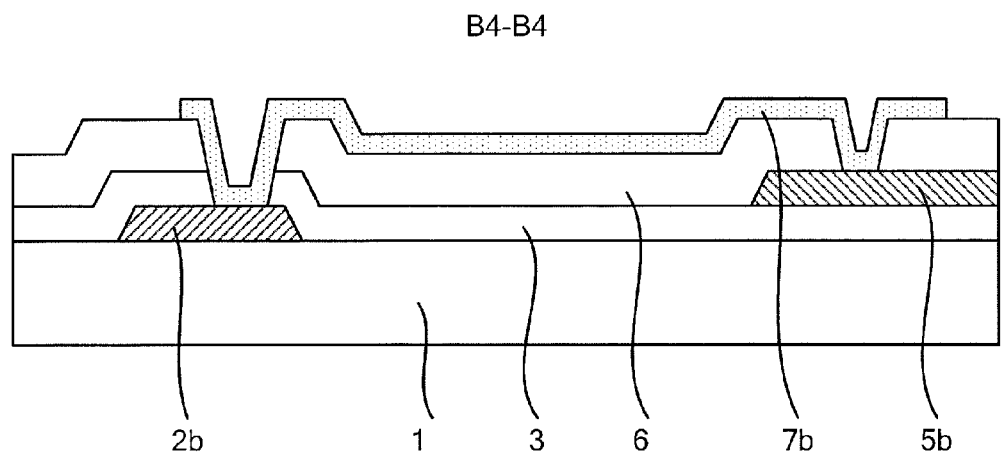
Figure 3D:
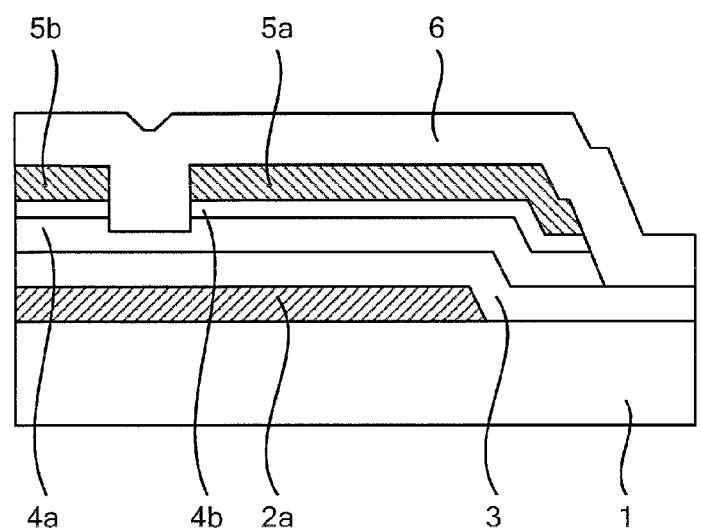

FIG. 3a shows a schematic view of the connection relationships between the test TFT and the gate line and the gate line test line, FIG. 3b shows a sectional view taken along the line A4-A4 of FIG. 3a, FIG. 3c shows a sectional view taken along the line B4-B4 of FIG. 3a and FIG. 3d shows a sectional view taken along the line C4-C4 of FIG. 3a.

FIG. 3a illustrates the planar structure of the test TFT, the test TFT may be formed simultaneously with the TFT in the display region. In the TFT-LCD array substrate according to the embodiment of the invention, the gate electrode 2a of the test TFT, the gate lines 2b and the gate electrode of the TFT in the display region are formed on the substrate 1. The active layer of the test TFT is formed on the gate electrode 2a, and the active layer of the TFT in the display region is formed on its own gate electrode. The active layer of the test TFT may comprise a semiconductor layer 4a and a doped semiconductor layer 4b, and the active layer of the TFT in the display region may also comprise a semiconductor layer and a doped semiconductor layer. The source electrode 5b and the drain electrode 5a of the test TFT are formed on the active layer, and a channel is formed between the source electrode 5b and the drain electrode 5a. The source electrode and the drain electrode of the TFT in the display region are formed on its own active layer, and a channel is formed between the source electrode and the drain electrode. The source electrode of the TFT in the display region is connected to the data line, while the drain electrode thereof is connected to the pixel electrode via a through hole.

As for the test TFT, the drain electrode 5a thereof may be provided in the same layer as the gate line test line 5c, that is, they are formed by an identical metal layer, and the drain electrode 5a is connected to the gate line test line 5c directly (as shown in FIG. 3a). Alternatively, the drain electrode 5a and the gate line test line 5c may be provided in different layers, and the drain electrode 5a may be connected to the gate line test line through a connection electrode and a through hole.

The gate electrode 2a of the test TFT is connected to the gate line test line 5c via a first connection electrode 7a. As the gate electrode 2a and the gate line test line 5c are provided in different metal layers, it is required to connect them using through holes. Specifically, a first through hole 6a is formed above the gate electrode 2a, a second through hole 6b is formed above the gate line test line 5c, and the first connection electrode 7a connects the gate electrode 2a of the test TFT to the gate line test line 5c through the first through hole 6a and the second through hole 6b.

The source electrode 5b of the test TFT is connected to the gate line 2b through a second connection electrode 7b. As the gate line 2b and the source electrode 5b are provided in different metal layers, it is required to connect them using through holes. Specifically, a third through hole 6c is formed above the source electrode 5b, a fourth though hole 6d is formed above the gate line 2b, and the second connection electrode 7b connects the source electrode 5b to the gate line 2b through the third through hole 6c and the fourth through hole 6d.

The first connection electrode 7a and the second connection 7b of the test TFT may be provided in the same layer as the pixel electrode in the display region, in other words, the first connection electrode 7a, the second connection 7b and the pixel electrode may be formed by the same transparent conductive layer.

Hereinafter, the manufacturing process of the LCD according to the embodiment of the invention will be described. In the following descriptions, a patterning process may comprise the processes of applying photoresist, masking, exposing, etching and the like.

Figure 4A:
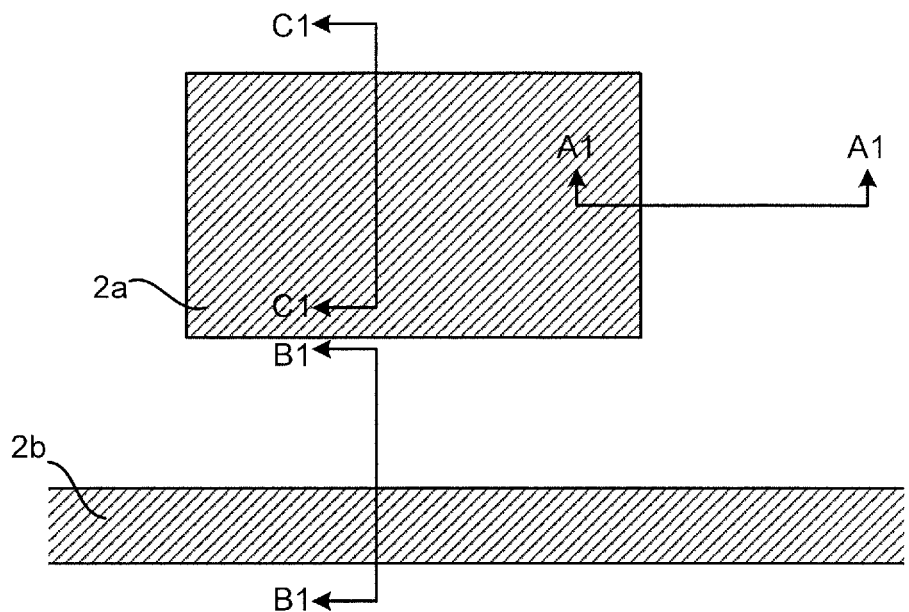
FIG. 4a shows a planar schematic view of the TFT-LCD array substrate according to an embodiment of the invention after a first patterning process.
Figure 4B:
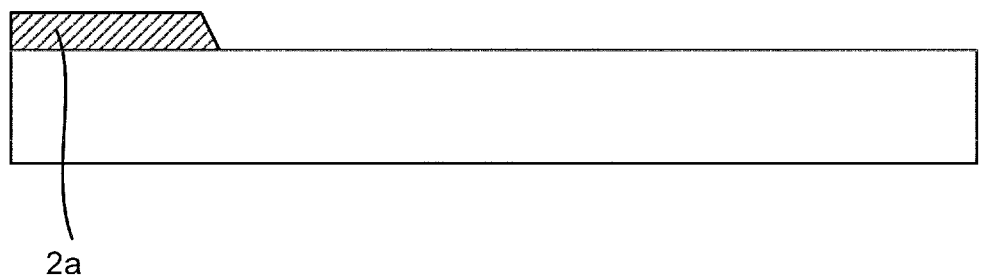
Figure 4C:
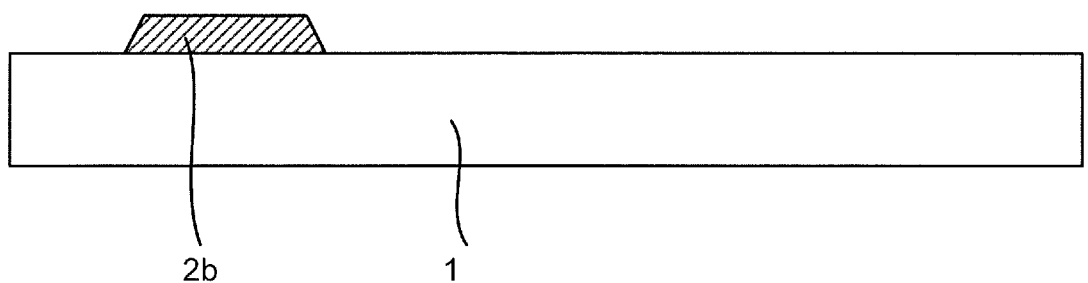
Figure 4D:
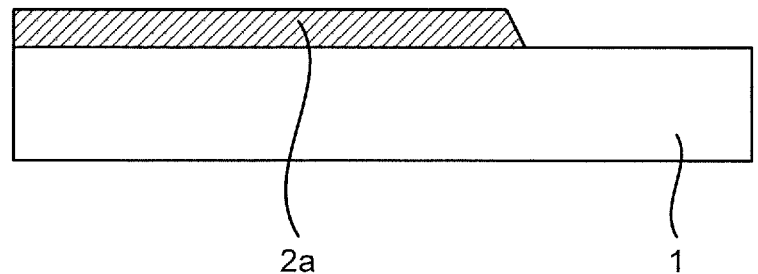

FIG. 4a shows a planar schematic view of the TFT-LCD array substrate according to an embodiment of the invention after a first patterning process, FIG. 4b shows a sectional view taken along the line A1-A1 of FIG. 4a, FIG. 4c shows a sectional view taken along the line B1-B1 of FIG. 4a and FIG. 4d shows a sectional view taken along the line C1-C1 of FIG. 4a.

By a sputtering method or a thermal evaporation method, a gate metal layer is deposited on the substrate 1 (e.g. a glass substrate or a quartz substrate). The gate metal layer may be made of Cr, W, Ti, Ta, Mo, Al, Cu or the alloys thereof. In addition, the gate metal layer may be made of multiple metal layers. Using a normal mask, the gate metal layer is etched by the first patterning process, so that the gate electrode 2a of the test TFT and the gate line 2b are formed on the substrate 1. The gate electrode of the TFT in the display region may be simultaneously formed in the first patterning process.

Figure 5A:
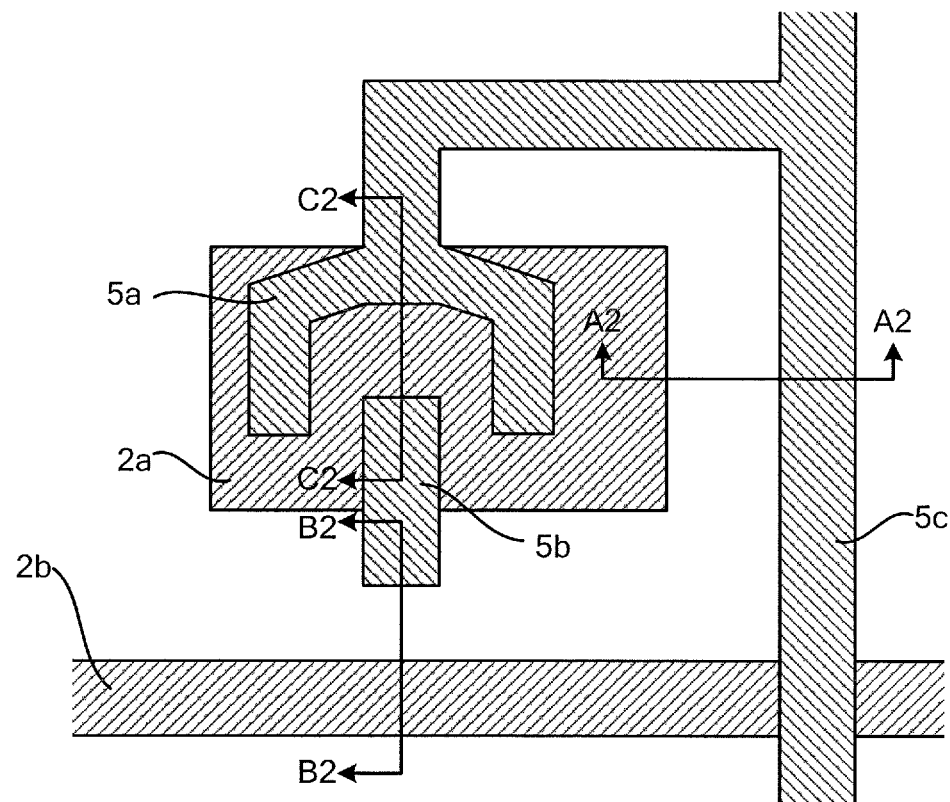
FIG. 5a shows a planar schematic view of the TFT-LCD array substrate according to an embodiment of the invention after a second patterning process.
Figure 5B:
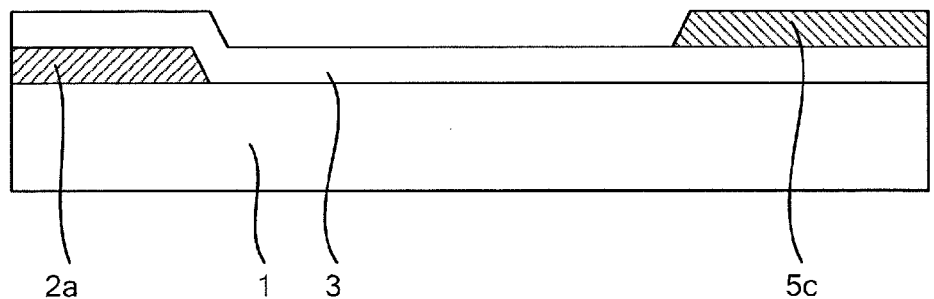
Figure 5C:
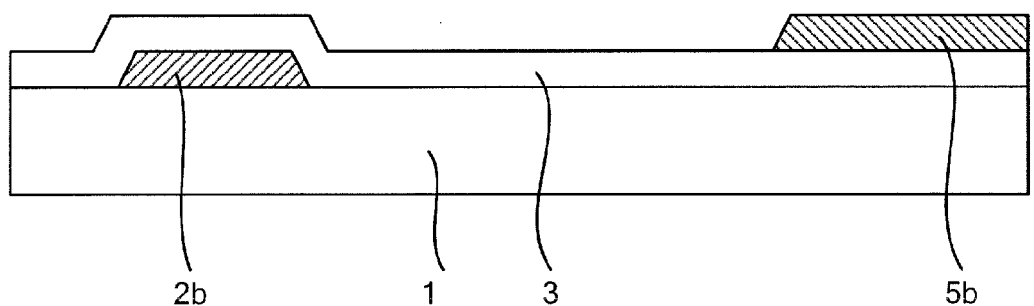
Figure 5D:
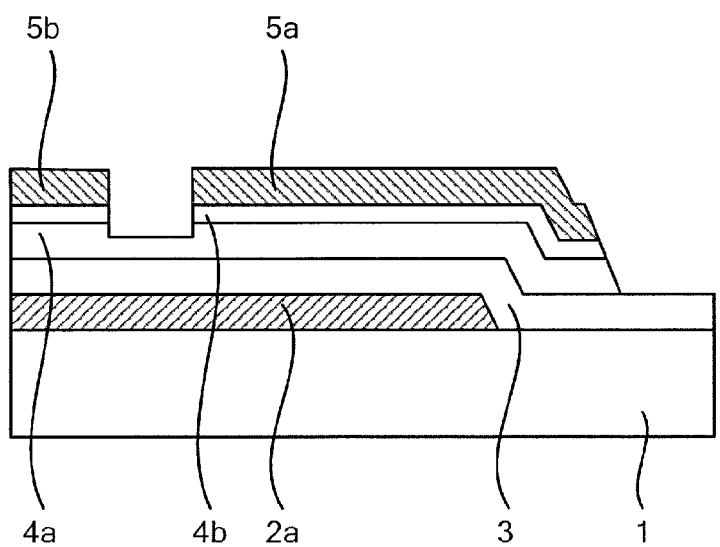

FIG. 5a shows a planar schematic view of the TFT-LCD array substrate according to an embodiment of the invention after a second patterning process, FIG. 5b shows a sectional view taken along the line A2-A2 of FIG. 5a, FIG. 5c shows a sectional view taken along the line B2-B2 of FIG. 5a and FIG. 5d shows a sectional view taken along the line C2-C2 of FIG. 5a. A gate insulating film is deposited by a plasma enhanced chemical vapour deposition (PECVD) method, thereby forming the gate insulating layer 3. The gate insulating layer 3 may be formed of oxides, nitrides, or oxynitrides, with the corresponding reactive gases being a mixture of $SiH_4$, $NH_3$, and $N_2$, or a mixture of $SiH_2Cl_2$, $NH_3$, and $N_2$. Thereafter, an active layer is formed on the substrate on which the gate insulating layer has been formed. The active layer may comprise a semiconductor layer and a doped semiconductor layer. Thereafter, a source/drain electrode metal layer is deposited on the doped semiconductor layer by a sputtering method or a thermal evaporation method, and the source/drain electrode metal layer may be formed of Cr, W, Ti, Ta, Mo, Al, Cu or the alloys thereof. After the deposition of the source/drain electrode metal layer, the second patterning process is performed so that the active layer, the source electrode 5b and the drain electrode 5a of the test TFT, the gate line test line 5c, the gate line test terminals (not shown in FIG. 5a-5d) and the channel of the test TFT are formed, wherein the drain electrode 5a is connected to the gate line test line 5c, the gate line test terminal is connected to the gate line test line 5c, the doped semiconductor layer at the channel is etched away and the semiconductor layer at the channel is partially etched away. During the second patterning process, the gate insulating layer, the active layer, the source electrode, the drain electrode, and the channel of the TFT in the display region and the data lines may be formed simultaneously.

The second patterning process may be a multi-step etching process and may employ a half tone mask or a gray tone mask.

In particular, after the completion of the deposition of the source/drain electrode metal layer, a photoresist is applied and exposed. The photoresist-completely-remained region corresponds to the regions for forming the source electrode 5b and the drain electrode 5a of the test TFT, the gate line test line 5c and the gate line test terminal, the photoresist-partially-remained region corresponds to the region for forming the channel of the test TFT, and the photoresist-completely-removed region corresponds to the remaining regions. It should be noted that, since it is also necessary to form the TFT in the display region, the TFT in the display region may be formed simultaneously with the test TFT. In this case, the photoresist-completely-remained region further corresponds to the regions for forming the source electrode, the drain electrode and the data lines in the display region, the photoresist-partially-remained region further corresponds to the channel of the TFT in the display region.

After a first etching process, the semiconductor layer, the doped semiconductor layer and the source/drain electrode metal layer in the photoresist-completely-removed region are etched away.

Then, an ashing process is performed to remove the photoresist at the channels of the test TFT and the TFT in the display region. Then, a second etching process is performed so that the doped semiconductor layer at the channels is removed and the semiconductor layer at the channels is partially removed, thereby forming the source electrodes and the drain electrodes of the test TFT and the TFT of the display region, and forming the gate line test line, the gate line test terminal and the data lines.

Figure 6A:
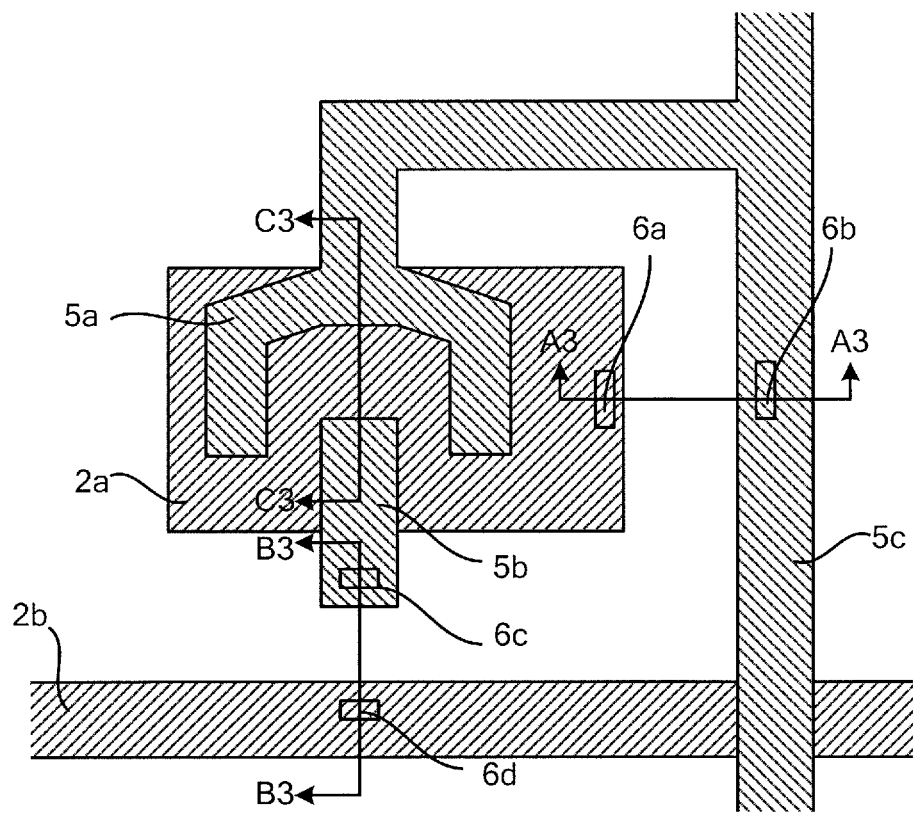
FIG. 6a shows a planar schematic view of the TFT-LCD array substrate according to an embodiment of the invention after a third patterning process.
Figure 6B:
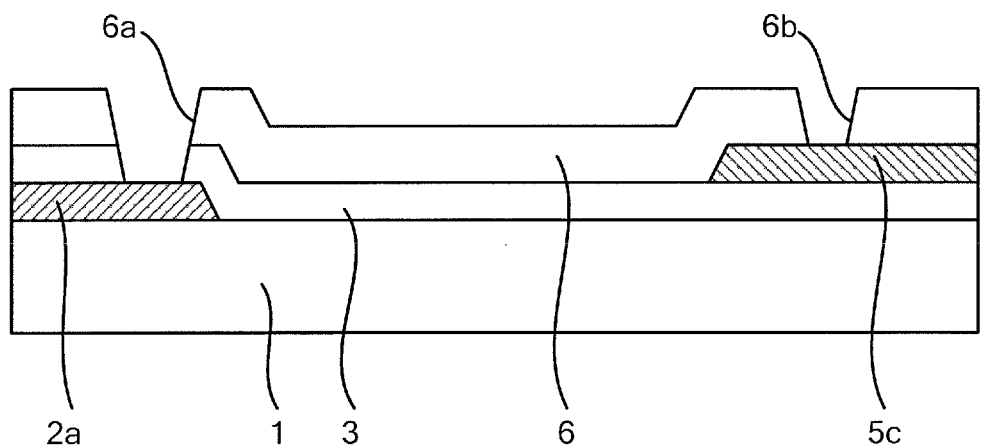
Figure 6C:
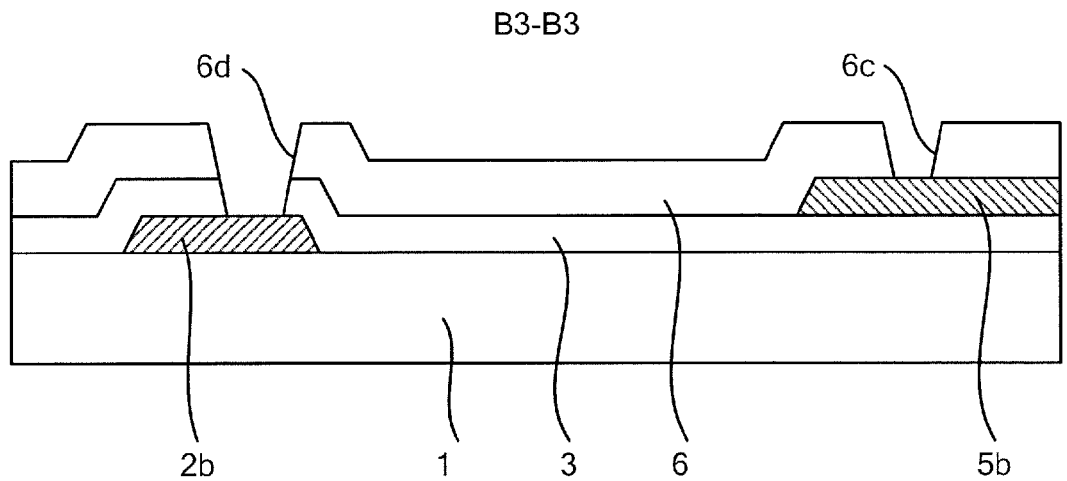
Figure 6D:
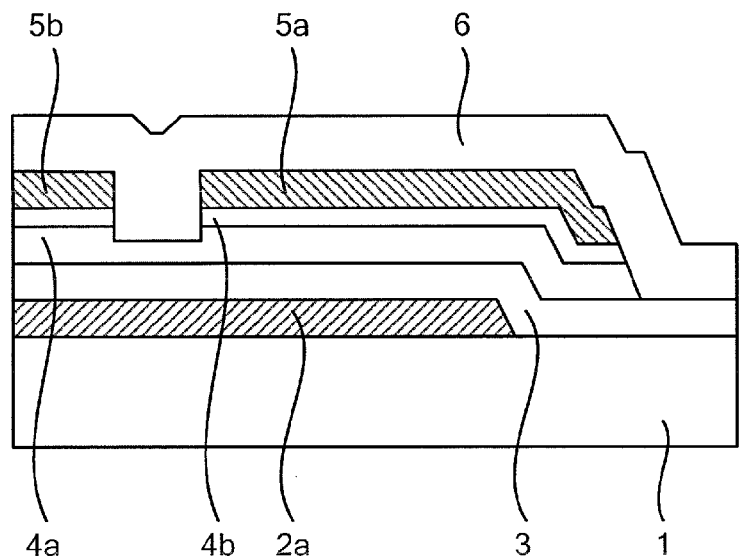

FIG. 6a shows a planar schematic view of the TFT-LCD array substrate according to an embodiment of the invention after a third patterning process, FIG. 6b shows a sectional view taken along the line A3-A3 of FIG. 6a, FIG. 6c shows a sectional view taken along the line B3-B3 of FIG. 6a and FIG. 6d shows a sectional view taken along the line C3-C3 of FIG. 6a. A passivation layer is deposited on the substrate by a PECVD method, and the passivation layer may be formed of oxides, nitrides, or oxynitrides, with the corresponding reactive gases being a mixture of SiH4, NH3 and N2, or a mixture of SiH2Cl2, NH3, and N2. Thereafter, a third patterning process is performed by a normal mask, so that the first through hole 6a is formed in the passivation layer 6 above the gate electrode 2a, the second through hole 6b is formed in the passivation layer 6 above the gate line test line 5c, the third through hole 6c is formed in the passivation layer 6 above the source electrode 5b, and the fourth through hole 6d is formed in the passivation layer 6 above the gate line 2b. The through hole corresponding to the drain electrode of the TFT in the display region may also be formed during the third patterning process.

On the substrate with the through holes formed thereon, a transparent conduction layer is deposited by a sputtering method or thermal evaporation method, and the transparent conduction layer may be made of indium tin oxide (ITO). The first connection electrode 7a and the second connection electrode 7b are formed by the fourth patterning process using a normal mask. The first connection electrode 7a connects the gate line 2a to the gate line test line 5c through the first through hole 6a and the second through hole 6b, while the second connection electrode 7b connects the source electrode 5b to the gate line 2b through the third through hole 6c and the fourth through hole 6d. The planar view and the sectional views of the TFT-LCD array substrate after the fourth patterning process are shown in FIGS. 4a, 4b, 4c and 4d, respectively. The pixel electrode of the display region may also be formed during the fourth patterning process.

The TFT-LCD array substrate according to the embodiment of the invention is not limited to the above manufacturing process, and it may be formed by other manufacturing process such as a manufacturing process using five patterning processes. For example, no half tone mask or gray tone mask is employed, and consequently, the active layer of the test TFT and the source and drain electrodes of the test TFT may be formed by two separate patterning processes. Specifically, after the first patterning process, the second patterning process may be performed by using a normal mask to form the active layer of the test TFT. Then, the source/drain electrode metal layer is deposited and a third patterning process is performed by using a normal mask, so that the source electrode, the drain electrode and the channel of the test TFT are formed and the gate line test line and the gate line test terminal are also formed. Then, the through holes and the two connection electrodes may be formed by other two patterning processes. In addition, it should be noted that, the structure of the test TFT is not limited to the above-mentioned structure, and it may be a bottom gate structure or a top gate structure.

According to an embodiment of the invention, a TFT-LCD is also provided. The TFT-LCD comprises the TFT-LCD array substrate as described above. The gate line test line is connected to the first terminal of the GOA circuit, and the first terminal may be the terminal used to keep the test TFT off. For example, the first terminal may be a grounding terminal of the GOA circuit. In addition, as to the N-type TFT, the first terminal may be a low-voltage terminal.

As mentioned above, after the assembling of the array substrate and the colour filter substrate, the gate line test terminal is cut away and the TFT-LCD performs normal display. If the gate line test line is not connected to the first terminal of the GOA circuit and keeps in a dangling state, it is easily interfered by other signals. In this case, since the gate line test line is connected to the test TFT, the test TFT may be turned on by the interfering signal on the gate line test line and thus the display in the display region is adversely influenced. Therefore, in order to avoid the interference of the gate line test line to the display in the display region, the gate line test line is connected to the first terminal. During the operation of the LCD, the GOA circuit is powered and the first terminal output a low-voltage signal or a grounding signal, so that each of the test TFTs can be reliably kept at the low voltage and thus each of the gate lines can not be interfered by the signals on the gate line test line and can work properly.

The TFT-LCD according to the embodiment of the invention may be of twisted nematic (TN) type, fringe field switching (FFS) type and the like.

According to the embodiment of the invention, the manufacturing method of the TFT-LCD array substrate comprises the following steps.

In Step 11, the gate line and the gate electrode of the test TFT are formed on the array substrate. The gate electrode of the TFT in the display region may be simultaneously formed in this step.

In Step 12, the active layer, the source electrode, the drain electrode and the channel of the test TFT, the gate line test line and the gate line test terminal are formed on the array substrate. The drain electrode and the gate electrode of the test TFT are connected to the gate line test line, the source electrode of the test TFT is connected to the gate line, and the gate line test terminal is connected to the gate line test line. In this step, the active layer, the source electrode and the drain electrode of the TFT in the display region and the data lines may also be formed.

In addition, the Step 12 may comprise the following steps

In Step 121, the active layer, the source electrode, the drain electrode and the channel of the test TFT are formed on the array substrate, and the gate line test line and the gate line test terminal are also formed on the array substrate. The gate line test terminal is connected to the gate line test line.

In Step 122, the passivation layer is formed on the array substrate and patterned by a patterning process, thus forming the first through hole above the gate line, the second through hole above the gate line test line, the third through hole above the source electrode of the test TFT, and the fourth through hole above the gate line.

In Step 123, the transparent conductive layer is formed on the array substrate and patterned by a patterning process, thus forming the first connection electrode and the second connection electrode. The first connection electrode connects the gate electrode of the test TFT to the gate line test line through the first through hole and the second through hole, and the second connection electrode connects the source electrode of the test TFT to the gate line through the third through hole and the fourth through hole.

In addition, the Step 121 may comprise the following steps.

In Step 121a, the gate insulating layer, the semiconductor layer, the doped semiconductor layer and the source/drain electrode metal layer are formed on the array substrate, and a photoresist layer is applied on the source/drain electrode metal layer.

In Step 121b, the photoresist layer is exposed by using a half tone mask. The photoresist-completely-remained region corresponds to the regions for forming the source electrode and the drain electrode of the test TFT, the gate line test line and the gate line test terminal, the photoresist-partially-remained region corresponds to the region for forming the channel of the test TFT, and the photoresist-completely-removed region corresponds to the remaining regions.

In Step 121c, the semiconductor layer, the doped semiconductor layer and the source/drain electrode layer in the photoresist-completely-removed region are removed by an etching process.

In Step 121d, the photoresist layer at the channel of the test TFT is removed by an ashing process and the doped semiconductor layer and a portion of the semiconductor layer at the channel of the test TFT are removed, thereby forming the source electrode, the drain electrode, the channel and the active layer of the test TFT, the gate line test line and the gate line test terminal. The gate line test terminal is connected to the gate line test line, and the drain electrode is connected to the gate line test line.

In the manufacturing process of the TFT-LCD array substrate according to embodiment of the invention, the test TFT can be simultaneously formed with the TFT in the display region. The gate electrode and the drain electrode of the test TFT are connected to the gate line test line, the gate electrode of the test TFT is connected to the gate line. In this case, during the test of the gate line formed on the array substrate comprising the GOA circuit, the testing signal can be input merely by the gate line test terminal and no complicated control signals are required, thereby the costs can be reduced.

It should be appreciated that the embodiments described above are intended to illustrate but not limit the invention. Although the invention has been described in detail herein with reference to the preferred embodiments, it should be understood by those skilled in the art that the invention can be modified and some of the technical features can be equivalently substituted without departing from the spirit and scope of the invention.

What is claimed is:

1. A TFT-LCD array substrate, comprising:
a gate line;
a gate line test line;
a gate line test terminal;
a gate line drive circuit connected to the gate line; and
a test TFT,
wherein a gate electrode and a drain electrode of the test TFT are connected to the gate line test line, a source electrode of the test TFT is connected to the gate line, and the gate line test terminal is connected to the gate line test line,
wherein the gate line test line is also connected with a first terminal of the gate line drive circuit,
wherein the gate line test line is provided outside the gate line drive circuit, and
wherein during a test process of the TFT-LCD array substrate, a test signal is transmitted to the gate line through the gate line test terminal, the gate line test line and the test TFT; and after the test process of the TFT-LCD array substrate is completed, a signal that keeps the test TFT off is output from the first terminal of the gate line drive circuit and is transmitted to the test TFT through the gate line test line.

2. The TFT-LCD array substrate according to claim 1, wherein the test TFT is provided between the gate line drive circuit and the gate line.

3. The TFT-LCD array substrate according to claim 1, wherein the gate electrode of the test TFT is connected to the gate line test line through a first connection electrode.

4. The TFT-LCD array substrate according to claim 3, wherein a first through hole is formed above the gate electrode of the test TFT, a second through hole is formed above the gate line test line, and the first connection electrode connects the gate electrode of the test TFT to the gate line test line through the first through hole and the second through hole.

5. The TFT-LCD array substrate according to claim 4, wherein the drain electrode of the test TFT is provided in the same layer as the gate line test line.

6. The TFT-LCD array substrate according to claim 5, wherein the first connection electrode is provided in the same layer as a pixel electrode in a display region of the TFT-LCD array substrate.

7. The TFT-LCD array substrate according to claim 1, wherein the source electrode of the test TFT is connected to the gate line through a second connection electrode.

8. The TFT-LCD array substrate according to claim 7, wherein a third through hole is formed above the source electrode of the test TFT, a fourth through hole is formed above the gate line, and the second connection electrode connects the source electrode of the test TFT to the gate line through the third through hole and the fourth through hole.

9. The TFT-LCD array substrate according to claim 8, wherein the second connection electrode is provided in the same layer as a pixel electrode in a display region of the TFT-LCD array substrate.

10. The TFT-LCD array substrate according to claims 1, wherein there are two gate line test terminals and a plurality of gate lines, and the odd-numbered gate lines are connected to one of the gate line test terminals while the even-numbered gate lines are connected to the other of the gate line test terminals.

11. A TFT-LCD, comprising:
a colour filter substrate; and
a TFT-LCD array substrate according to claim 1.

12. The TFT-LCD according to claim 11, wherein the first terminal is a grounding terminal or a low-voltage terminal of the gate line drive circuit.

* * * * *